Figure 1:
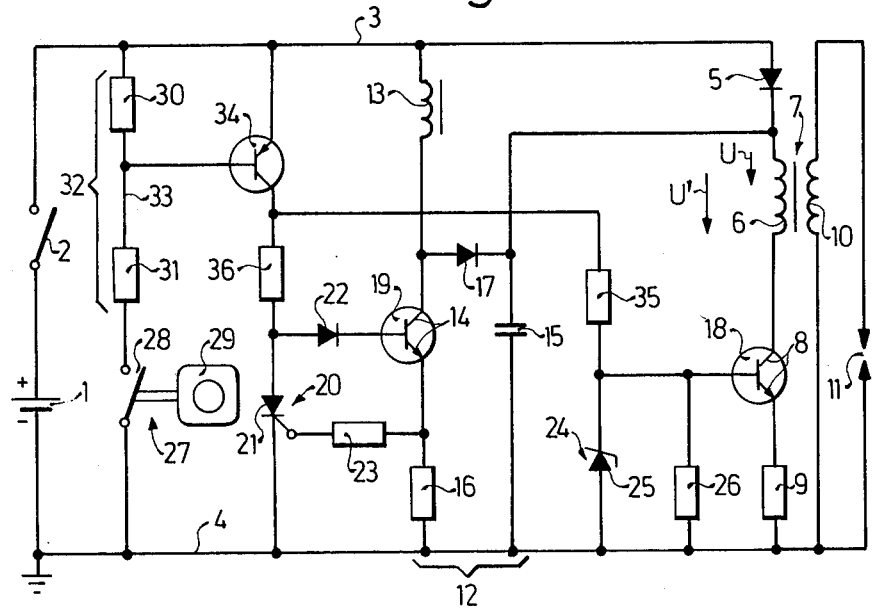

United States Patent [19]

Jundt

[11] 4,059,084
[45] Nov. 22, 1977

[54] IGNITION SYSTEM FOR INTERNAL COMBUSTION ENGINES USING AN IGNITION COIL

[75] Inventor: Werner Jundt, Ludwigsburg, Germany

[73] Assignee: Robert Bosch G.m.b.H., Stuttgart, Germany

[21] Appl. No.: 618,573

[22] Filed: Oct. 1, 1975

[30] Foreign Application Priority Data

Oct. 12, 1974 Germany .................... 2448675

[51] Int. Cl.$^2$ .................................. F02P 3/02
[52] U.S. Cl. ................................. 123/148 E
[58] Field of Search ................... 123/148 E

[56] References Cited

U.S. PATENT DOCUMENTS

| | | | |
|---|---|---|---|
| 3,280,809 | 10/1966 | Issler | 123/148 E |
| 3,575,154 | 4/1971 | Taylor | 123/148 E |
| 3,605,713 | 9/1971 | LeMasters et al. | 123/148 E |
| 3,645,246 | 2/1972 | Campbell et al. | 123/148 E |
| 3,844,266 | 10/1974 | Peterson | 123/148 E |
| 3,919,993 | 11/1975 | Neuman | 123/148 E |

*Primary Examiner*—Ronald H. Lazarus
*Assistant Examiner*—P. S. Lall
*Attorney, Agent, or Firm*—Flynn & Frishauf

[57] ABSTRACT

An auxiliary voltage, which may be in the order of ten times the value of the battery voltage in an automotive vehicle, is provided by a voltage transformer generating circuit connected to the battery, and providing an additional voltage to the primary of the ignition coil to accelerate the rate of rise of current flow therethrough and provide for reliable energy storage in the primary of the ignition coil even at high engine speeds and rapidly succeeding ignition events. The auxiliary voltage is preferably generated by an auxiliary inductance coil connected to an auxiliary switching transistor which is gated OFF when the current flow through the inductance coil has reached a predetermined value, the resulting voltage peak being transferred over a storage capacitor to the primary of the ignition coil.

11 Claims, 2 Drawing Figures

IGNITION SYSTEM FOR INTERNAL COMBUSTION ENGINES USING AN IGNITION COIL

The present invention relates to an ignition coiltype ignition system for internal combustion engines, in which current flow through the primary winding is interrupted at the instant that the spark is to be generated by a switch, typically a semiconductor switch in series with the primary winding.

The ignition coil of the ignition system used with internal combustion engines customarily generates a main ignition pulse by providing energy for a main discharge. After the main discharge, smaller trailing discharges still occur which may be termed spark trails. These subsidiary discharges are important in reliably igniting air-fuel mixtures which are not of proper or readily ignitable composition. As the speed of the engine increases, the time available for current flow through the primary winding of the ignition coil decreases more and more until the time becomes insufficient to permit rise of the current through the coil to the requisite level which provides maximum energy for the ignition spark, that is, both for the main spark as well as for the auxiliary or trailing sparks. As a result, reliability of operation of the internal combustion engine, and ignition thereof, can no longer be ensured.

It is an object of the present invention to provide an ignition system of the ignition coil type in which the current flow is so controlled that sufficient current is available for proper ignition pulses, even at high engine speeds.

SUBJECT MATTER OF THE PRESENT INVENTION

Briefly, an auxiliary voltage is generated which is temporarily applied to the primary of the ignition coil during current flow therethrough. The polarity of this auxiliary voltage is the same as the voltage of the main power source for the ignition coil, typically the battery of an automotive vehicle. The voltage level, however, of the auxiliary voltage is higher than that of the main energy source.

Figure 2:
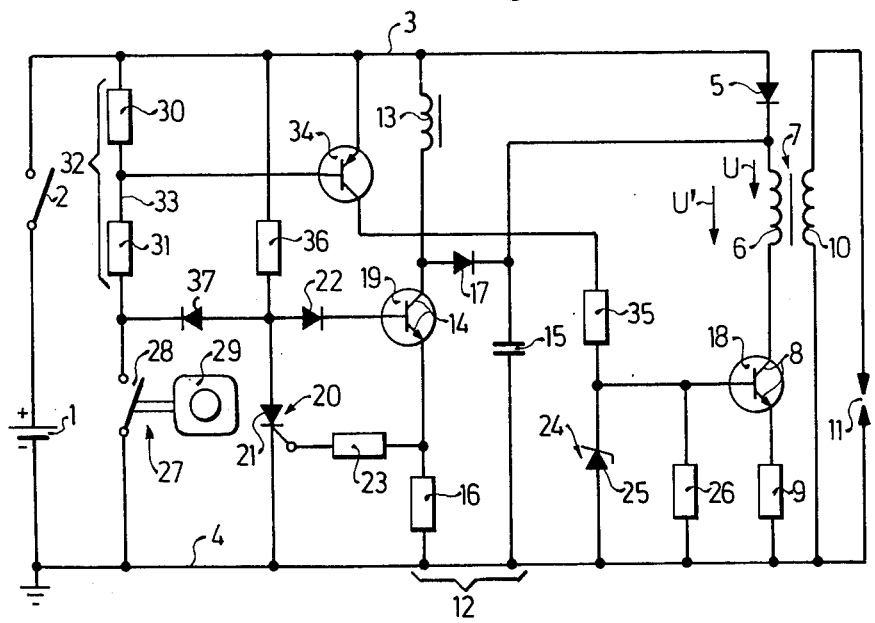

The invention will be described by way of example with reference to the accompanying drawings, wherein:

FIG. 1 is a general, highly schematic circuit diagram of an ignition system in accordance with the present invention; and FIG. 2 illustrates another embodiment of the ignition system, in which like parts have been given like reference numerals.

A battery 1, typically the battery of an automotive vehicle, is connected through ignition switch 2 (FIG. 1) to positive bus 3 of the supply system for the ignition. The negative terminal of the battery is connected to ground, or chassis of the vehicle, forming a common ground bus 4.

The energy source, that is battery 1, supplies energy through a diode 5, poled in current passing direction to the primary 6 of an ignition coil 7. In series with the primary 6 is an ignition switch path 8, as shown, the collector-emitter path of a transistor 18, and a current limiting resistor 9. The secondary 10 of ignition coil 7 is connected to a spark plug 11. The distributor connections and the like have been omitted for clarity although the system is applicable, of course, to internal combustion engines of any number of cylinders.

Primary winding 6 is subjected to two voltages, namely voltage U, derived from the battery 1, and an auxiliary voltage U'. Voltage U' has the same polarity as the voltage U derived from battery 1, but has a higher value than the voltage U, preferably about ten times as much. The auxiliary voltage U' is preferably derived from current source 1 and is applied to the primary 6 over a voltage transformer or converter circuit 12.

The voltage converter circuit 12 includes, in a preferred form, an induction coil 13 and an auxiliary switching path 14 in series with the induction coil 13, as well as a shunt storage capacitor 15 in parallel to the switching path 14. Induction coil 13 is connected to the supply bus 3 in advance of diode 5; the auxiliary switching path 14 is connected through a current flow sensing capacitor 16 to the ground bus 4. A diode 17 connects the junction of auxiliary switching path 14 and inductor 13 to the capacitor 15, and further connects the capacitor to the primary winding 6 of the ignition coil 7. The circuit for the auxiliary voltage pulse is closed through the primary of the ignition coil, the main switching path 8, current limiting resistor 9 and the chassis return bus 4. Diode 17 is poled in the same direction as diode 5, that is, it passes current from the current source 1 to capacitor 15 and hence to coil 6.

The ignition switching path 8 is formed by the emitter-collector path of switching transistor 18. The auxiliary switching path 14 is formed by the emitter-collector path of an npn auxiliary transistor 19, the collector of which is connected to the inductor 13 and the emitter to the sensing resistor 16.

Inductor 13 has a low resistance, for example in the order of about 0.05 ohms, and an inductance in the order of about 0.8 milihenry; capacitor 15 should be capable of operating at voltages of above 120 V, to accept charges in that order of magnitude; the primary winding 6 of ignition coil 7 may have, for example, about 2 ohms resistance, and an inductance of 24 milihenry, with a winding designed for somewhat over 2A, assuming a supply voltage of about 12 V.

The auxiliary switching path 14 changes state when a certain predetermined current flows through the induction coil 13. Control is effected, simply, by connecting a sensing switch 20 to the base-emitter circuit of the auxiliary transistor 19; change-over of state of control switch 20 is made dependent on current flow in the induction coil 13. As shown, the control switch 20 comprises a thyristor 21 having its cathode connected to chassis bus 4, and its anode through a diode 22 to the base of the auxiliary transistor 19. The gate electrode of thyristor 21 is connected through a coupling resistor 23 with the junction between the emitter of transistor 19 and resistor 16.

A Zener diode 24, forming a stabilizing element, maintains current at a constant level after the current through the primary winding 6 of ignition coil 7 has reached a predetermined value. Zener diode 25 is connected in parallel to the base-emitter path of transistor 18 and the current limiting resistor 9 in series therewith. A resistor 26 further stabilizes the entire circuit and reliably holds transistor 18 in blocked condition, when commanded to change to that state.

Both the main switching transistor 18 as well as the auxiliary transistor 19 are controlled by a common signal source 27, controlled in turn by the internal combustion engine. Signal source 27 may be the customary, usual distributor, ignition breaker terminal 28, which is periodically opened by a cam 29, rotating in synchronism with operation of the internal combustion engine. Upon opening of switch 28, the main switching path 8 is controlled to change into current blocking state. Closing of the switch contact 28 causes closing of the main switching path 8 to current carrying state, as well as closing of the auxiliary switching path 14 to current carrying state. The switch 28 is connected at one terminal to chassis bus 4; the other terminal of switch 28 is connected to a voltage divider 32 formed of resistors 30, 31 and having a tap or connection point 33, which voltage divider is connected to positive bus 3 of the supply source. The tap point 33 of the voltage divider is connected to the base of a pnp transistor 34, the emitter of which is connected to supply bus 3, and the collector through resistor 36 to the junction of the anodes of diodes 22 and thyristor 21. The collector is further connected through a current control resistor 35 to the base of the main switching transistor 18.

The induction coil 13 preferably is an iron core coil, separately located and arranged from ignition coil 7 and of substantially lower inductivity than the primary winding 6 of ignition coil 7. The inductivity of inductor 13 may be, for example, about thirty times smaller than the inductivity of the primary winding 6 of the ignition coil 7.

Operation: Let it be assumed that ignition switch 2 is closed, so that the ignition system is ready for operation; let it further be assumed that an ignition event has just occurred and breaker contact 28 is about to be closed again.

Closing of breaker contact 28 connects current flow to the base-emitter path of control transistor 34, which controls the emitter-collector path of transistor 34 to change to conductive state. This also causes auxiliary transistor 19 to become conductive, so that the auxiliary switching path 14 is likewise in "connected" or "ON" state. Current will now flow through induction coil 13. Current is also applied from the conductive emitter-collector path of control transistor 34 to the base-emitter path of main switching transistor 18 through resistor 35, so that the main switching path 8 likewise will be ON and current will commence to flow from source 1 through primary winding 6 of ignition coil 7. When the current flowing through the inductor 13 has reached a predetermined value, for example 11 A, then the voltage drop across resistor 16 will have reached a value which, when transferred to the gate of thyristor 21, controls the thyristor 21 to fire. Bias is thus removed from the base of the auxiliary transistor 19, and the auxiliary switching path 14 will block, that is, will be controlled OFF. The energy stored in the induction coil 13, which will be about 50 milliwatt seconds is transferred to the storage capacitor 15. Storage capacitor 15 has a value of about 6.8 $\mu$ F. Discharge of the capacitor in reverse direction is inhibited by the diode 17. The capacitor 15 will thus charge to a value of about 120 V, which additional voltage is applied as the auxiliary voltage U' to the primary winding 6 of ignition coil 7. This auxiliary voltage substantially increases the rate of rise of current flow to the limiting value of current through the primary of ignition coil 7 — about 2.1 A — so that the energy to generate the spark at the plug 11 is available at an earlier instant of time than would be the case if auxiliary voltage U' were absent. This spark energy is about 50 milliwatt seconds. The rate of rise of current through inductor 13 is approximately linear. During the effective duration of the voltage U', diode 5 prevents backflow, or back-discharge of the capacitor to source 1, and effectively provides for application of all the additional voltage to the primary 6 of the ignition coil 7.

At the ignition instant, interrupter switch 28 will open. The control current flowing through the base-emitter path of control transistor 34 will thus be interrupted, and the emitter-collector path, and as the result the switching transistor 18, will change over to blocked state. The sudden interruption of current flow through coil 6 results in a high-voltage pulse which causes the electrical discharge, that is, the spark at spark plug 11.

Upon subsequent closing of switch 28, the cycle will repeat.

The circuit of FIG. 2 is similar to that of FIG. 1, and like parts have been given like reference numerals and will not be explained again. The basic difference is the control of the auxiliary switching path 14. In accordance with FIG. 2, control of the switching path of auxiliary transistor 19 is dependent on switching of the breaker contact 28. Resistor 36 is not connected to the collector of the control transistor 34, but rather to supply line 3; an additional blocking diode 37 connects the junction of resistor 36 and the anodes of diode 22 and thyristor 21 to voltage divider 32.

Operation of circuit of FIG. 2: Basically, the circuit of FIG. 2 operates similarly to that of FIG. 1; more time is available, however, for storage of the additional energy which generates the auxiliary voltage, thus permitting selection of an induction coil 13 having a higher inductance value and a lower nominal current flowing therethrough. The auxiliary transistor 19 which forms the auxiliary switching path 14 thus can be made of a unit which is capable of carrying only lower current values, thus having less dissipation. The auxiliary voltage U' accelerates current rise in the primary winding 6 as soon as the switching path 8, that is, transistor 18 switches ON, that is, in conductive condition. Thus, the time during which current flows through the primary winding 6 can be selected to be somewhat less, permitting use of a smaller closing angle for the breaker contact 28. Alternatively, or additionally thereto, the energy being supplied by the additional voltage U' can be reduced. In actual operation, when the thyristor 20 has fired, so that transistor 19 will cut off as a consequence, the energy stored in inductance 13 is immediately transferred to the capacitor 15. As soon as transistor 19 has blocked, the thyristor gate voltage is removed and the thyristor will recover since current flow through resistor 36 is less than the holding current of thyristor 21. As soon as thyristor 21 has recovered, transistor 19 will immediately be gated ON again, thus re-establishing current flow through inductor 13.

Various changes and modifications may be made within the scope of the inventive concept.

The timing of switching ON of transistor 19, for example, can be selected with respect to the open, or closed state, respectively, of the breaker contacts 28, as desired. In FIG. 2, transistor 19 will become conductive as soon as the breaker contacts 28 open, and will remain conductive upon subsequent closing thereof, and until the current through the inductance coil 13 has reached the threshold value at which the threshold switch 20 controls transistor 19 to block, or turn OFF. In FIG. 1, auxiliary switching path 14 will close, that is, transistor 19 will be gated ON upon reclosing of the contact 28, after opening, triggering an ignition event. The voltage U' occurs in a period of time immediately subsequent to an ignition event, that is, after the main switching path 8 has opened and is again re-closed.

I claim:

1. Ignition system for internal combustion engines having a source of electrical energy (1),
and comprising means cyclically timing and commanding generation of ignition energy at an ignition instant,
an ignition coil (7) connected to the source of energy (1) and a blocking circuit (8) forming a switching current path and interrupting current flow from the source (1) through the primary (6) of the coil (7), at the ignition instant;
voltage generating means (12) including a voltage converter, or transformer, connected to said source (1) generating an auxiliary voltage (U') having the same polarity as the voltage applied by said source (1) to said coil, and a voltage level which is higher than the voltage applied to the primary of the ignition coil (7) by said source, (1);
said voltage converter or transformer (12) including an induction coil (13) and an auxiliary switching path (14) connected in series therewith, said coil (13) and switching path (14) series circuit being connected to the current source (1);
a storage capacitor (15) connected across the switching path (14) and in parallel to the primary winding (6) of the ignition coil and the main switching path (8) to store energy being transferred from said inductance coil and apply said stored energy to the primary winding (6) of the ignition coil,
current sensing means (16) connected in series with the auxiliary switching path (14); control means (20, 21, 22, 23) connected to and controlling the switching state of said auxiliary switching path (14) in dependence on current flow through the inductance coil (13); and means (16, 17, 23, 21) connecting the voltage generating means to the primary winding (6) of said ignition coil (7) at a time instant is earlier than the occurrence of said ignition instant to apply said auxiliary voltage (U') to the ignition coil (7) supplementary to the energy supplied to the ignition coil (7) by said source (1) to increase the rate of rise of current therethrough.

2. System according to claim 1, wherein the control means comprises a threshold switch (20) connected to the sensing means in the auxiliary switching path and sensing when the current through the inductance coil and the auxiliary switching path has reached a predetermined value; said auxiliary switching path including a switching transistor, the threshold switch controlling the switching state of said auxiliary transistor (19) in dependence on said current flow.

3. System according to claim 1, further comprising a stabilizing element (24) connected in circuit with the main switching path (8, 18) to stabilize the rate of current rise of current flow through the primary winding (6) upon closing of said main switching path (8).

4. System according to claim 1, wherein the inductance value of the inductance coil (13) is smaller than the inductance value of the primary winding (6) of the ignition coil (7).

5. System according to claim 1, wherein the auxiliary voltage (U') has approximately ten times the voltage level of the voltage (U) of said source (1).

6. System according to claim 1, wherein the connecting means includes a coupling diode (17) connected between the storage capacitor (15) and the inductance coil (13) to couple energy from the inductance coil to the storage capacitor (15), but prevent discharge of the storage capacitor (15) through the series circuit comprising the inductance coil (13) and the auxiliary switching path (14) and forcing discharge of the capacitor (15) through the primary winding (6) of the ignition coil (7) and the main switching path (8).

7. System according to claim 1, further comprising a blocking diode (5) connected between the source (1) and the primary (6) of the inductance coil (7), said diode (6) being connected in current conductive direction from the source through said primary (6);
said storage capacitor (15) being connected to the junction of said diode (5) and the primary (6) of the ignition coil (7), said blocking diode (5) preventing discharge of said capacitor (15) through the source (1).

8. System according to claim 1, wherein the main switching path (8) comprises the emitter-collector path of a main switching transistor (18) and
wherein the auxiliary switching path (14) comprises the emitter-collector path of an auxiliary transistor (19);
and a signal source (27) controlled by the internal combustion engine and connected to and controlling the switching state of both said transistors (18, 19).

9. System according to claim 8, wherein said signal source (27) is the ignition breaker contact (28) of the internal combustion engine, said ignition breaker contact being connected to and controlling the main switching path (8) to change switching state upon opening of the breaker contact (28).

10. System according to claim 8, wherein said signal source (27) comprises the breaker contacts (28) of the ignition system of the internal combustion engine;
said breaker contacts being connected to and controlling closing of the main switching path (8) and closing of the auxiliary switching path (14) in dependence upon closing of the breaker contact (28).

11. System according to claim 8, wherein the signal source (27) comprises the breaker contacts (28) of the ignition system of the internal combustion engine;
said breaker contacts being connected to control closing of the main switching path (8) upon closing of the breaker switch (28), and being further connected to and controlling closing of the auxiliary switching path (14) upon opening of the breaker switch.

* * * * *